(12) United States Patent
Greeley et al.

(10) Patent No.: US 8,252,119 B2
(45) Date of Patent: Aug. 28, 2012

(54) MICROELECTRONIC SUBSTRATE CLEANING SYSTEMS WITH POLYELECTROLYTE AND ASSOCIATED METHODS

(75) Inventors: Joseph N. Greeley, Boise, ID (US); Nishant Sinha, Boise, ID (US); Lukasz Hupka, Salt Lake City, UT (US); Timothy A. Quick, Boise, ID (US); Prashant Raghu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 12/195,003

(22) Filed: Aug. 20, 2008

(65) Prior Publication Data
US 2010/0043824 A1 Feb. 25, 2010

(51) Int. Cl.
B08B 3/08 (2006.01)
(52) U.S. Cl. .................. 134/2; 134/3; 510/175
(58) Field of Classification Search ............... 134/2, 3, 134/42
See application file for complete search history.

(56) References Cited

U.S. PATENT DOCUMENTS

| | | | |
|---|---|---|---|
| 5,968,280 A | 10/1999 | Ronay | |
| 6,024,801 A | 2/2000 | Wallace et al. | |
| 6,575,177 B1 | 6/2003 | Brown et al. | |
| 6,905,550 B2 * | 6/2005 | Labib | 134/2 |
| 7,011,574 B2 | 3/2006 | Simpson et al. | |
| 7,029,373 B2 | 4/2006 | Ma et al. | |
| 7,270,130 B2 | 9/2007 | Ramachandran et al. | |
| 7,312,153 B2 | 12/2007 | Coletti et al. | |
| 7,314,578 B2 | 1/2008 | Choi et al. | |
| 2004/0029494 A1 * | 2/2004 | Banerjee et al. | 451/39 |
| 2006/0272677 A1 | 12/2006 | Lee et al. | |
| 2007/0265174 A1 * | 11/2007 | Schlenoff | 508/106 |
| 2008/0044990 A1 | 2/2008 | Lee | |
| 2009/0056744 A1 * | 3/2009 | Carswell | 134/1.3 |

FOREIGN PATENT DOCUMENTS

WO 2007019342 A2 2/2007

OTHER PUBLICATIONS

Cho, Chae-Woong et al., "Atomic force microscopy study of molecular weight of poly(acrylic acid) in chemical mechanical planarization for shallow trench isolation," J. Mater. Res., vol. 21, No. 2, pp. 473-479, Feb. 2006.
Feick, J.D. and D. Velegol, "Measurements of Charge Nonuniformity on Polystyrene Latex Particles," Langmuir, vol. 18, No. 9, pp. 3454-3458, Americal Chemical Society, 2002.
Park, Jin-Goo and A. Busnaina, "Cu Post-CMP Cleaning and the Effect of Additives," Semiconductor International, Aug. 1, 2005.

* cited by examiner

*Primary Examiner* — Michael Kornakov
*Assistant Examiner* — Natasha Campbell
(74) *Attorney, Agent, or Firm* — Perkins Coie LLP

(57) ABSTRACT

Several embodiments of cleaning systems using polyelectrolyte and various associated methods for cleaning microelectronic substrates are disclosed herein. One embodiment is directed to a system that has a substrate support for holding the microelectronic substrate, a dispenser positioned above the substrate support and facing a surface of the microelectronic substrate, a reservoir in fluid communication with the dispenser via a conduit, and a washing solution contained in the reservoir. The washing solution includes a polyelectrolyte.

18 Claims, 5 Drawing Sheets

MICROELECTRONIC SUBSTRATE CLEANING SYSTEMS WITH POLYELECTROLYTE AND ASSOCIATED METHODS

TECHNICAL FIELD

The present disclosure is related to microelectronic substrate cleaning systems with polyelectrolyte and associated methods of cleaning microelectronic substrates.

BACKGROUND

Manufacturing microelectronic devices typically includes physically and/or chemically processing microelectronic substrates. For example, a layer of material can be added to microelectronic substrates with physical vapor deposition (PVD), chemical vapor deposition (CVD), or atomic layer deposition (ALD) processes. A layer of material can also be removed from microelectronic substrates with dry etching, wet etching, chemical-mechanical polishing, or electro-chemical-mechanical polishing processes. All of these processes can leave solid particles adsorbed onto surfaces of the microelectronic substrates. If not removed, the particles can adversely impact subsequent processing and/or the performance of microelectronic devices formed in the microelectronic substrates.

One conventional cleaning technique includes washing microelectronic substrates with an aqueous solution of hydrogen peroxide ($H_2O_2$), ammonium hydroxide ($NH_4OH$), and/or hydrochloric acid (HCl) while applying physical energy (e.g., megasonic waves). However, as dimensions of microelectronic features (e.g., trenches, apertures, etc.) decrease, the applied physical energy may damage the ever smaller microelectronic features. If physical energy is not applied in the cleaning process, then the process tends to have low particle removal efficiencies. Accordingly, there is a need for improved cleaning systems and methods that can more effectively remove particles from microelectronic substrates without damaging the microelectronic features.

DETAILED DESCRIPTION

Various embodiments of cleaning systems using a polyelectrolyte and various methods of cleaning microelectronic substrates with improved particle removal efficiencies are described below. The term "microfeature substrate" is used throughout to include substrates upon which and/or in which microelectronic devices, micromechanical devices, data storage elements, read/write components, and other features are fabricated. Such a microelectronic substrate can include one or more conductive and/or nonconductive layers (e.g., metallic, semi-conductive, and/or dielectric materials) that are situated upon or within one another. These conductive and/or nonconductive layers can also include a wide variety of electrical elements, mechanical elements, and/or systems of such elements in the conductive and/or nonconductive layers (e.g., an integrated circuit, a memory, a processor, a microelectromechanical system, etc.) The term "surface" can encompass planar and nonplanar surfaces of a microelectronic substrate with or without patterned and non-patterned features. The term "polyelectrolyte" generally refers to a polymeric compound formed from monomers individually having an electrolytic functional group. The electrolytic functional group can be either anionic or cationic. The electrolytic functional group can also be either hydrophilic or hydrophobic. Particle removal efficiency (PRE) generally refers to a percentage of adsorbed solid particles removed from a microelectronic substrate. In the following description, the PRE can be determined by (1) counting a first number of the adsorbed particles using dark-light inspection and/or other suitable inspection techniques; (2) counting a second number of the adsorbed particles using dark-light inspection after a cleaning process; (3) subtracting the second number from the first number to derive a number of particles removed; and (4) dividing the number of particles removed by the first number to derive the PRE. A person skilled in the relevant art will also understand that the disclosure may have additional embodiments, and that the disclosure may be practiced without several of the details of the embodiments described below with reference to FIGS. 1-5.

Figure 1:
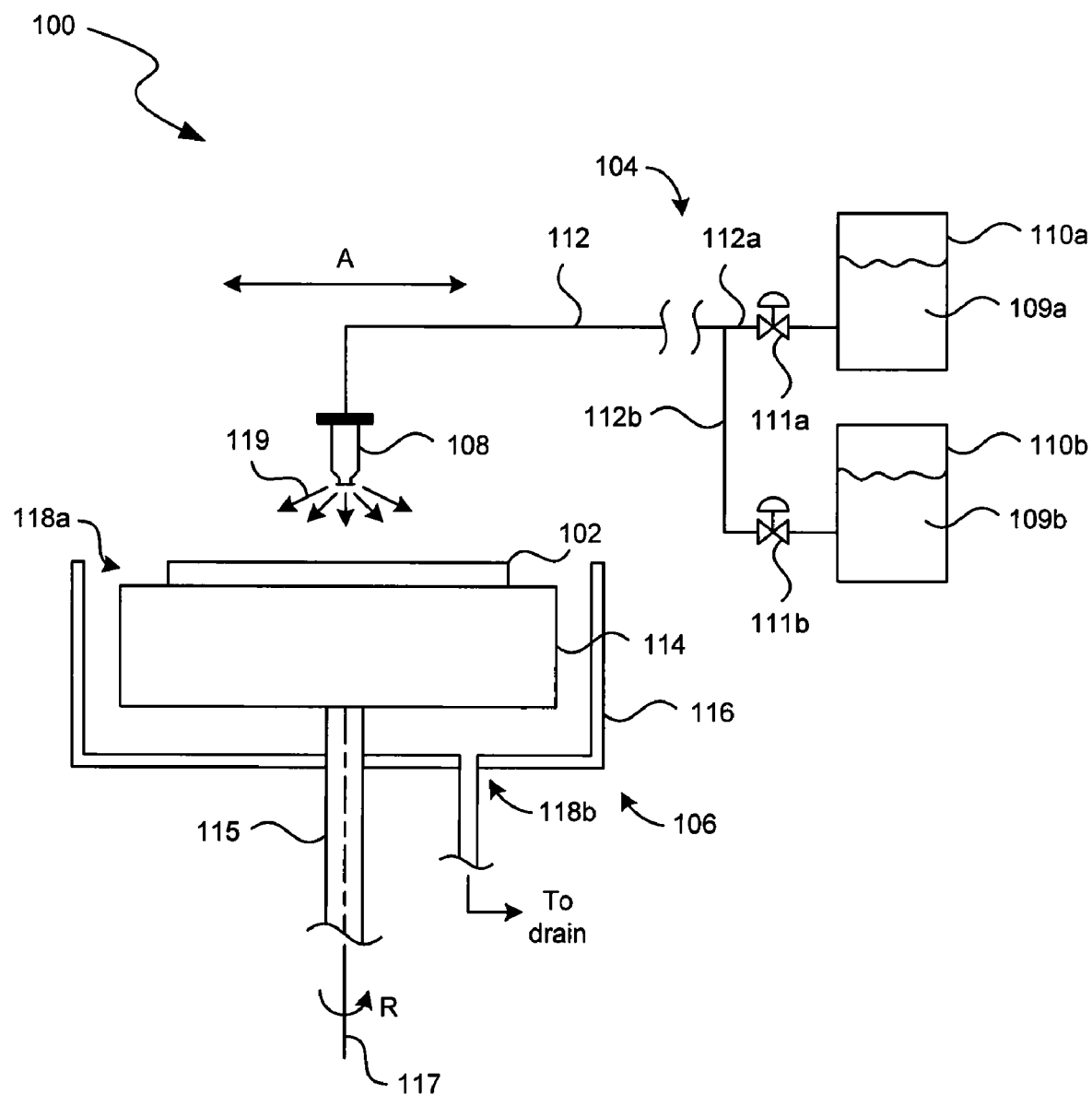
FIG. 1 is a schematic view of a cleaning system configured in accordance with an embodiment of the disclosure.

FIG. 1 is a schematic view of an embodiment of a cleaning system 100 for cleaning a microelectronic substrate 102 in accordance with an embodiment of the disclosure. As shown in FIG. 1, the cleaning system 100 can include a dispensing assembly 104 positioned above a substrate supporting assembly 106. In several embodiments, the cleaning system 100 can be configured as an independent unit. In other embodiments, the dispensing assembly 104 and/or the substrate supporting assembly 106 can be incorporated into a chemical-mechanical polishing (CMP) apparatus, an electrochemical-mechanical polishing (ECMP) apparatus, and/or other suitable microelectronic substrate processing equipment.

In the illustrated embodiment, the dispensing assembly 104 includes a dispenser 108, a first reservoir 110a holding a first washing solution 109a, and a second reservoir 110b holding a second washing solution 109b. The dispenser 108 can include a nozzle, an atomizer, and/or other suitable delivery or dispensing component. The first and second reservoirs 110a-b can be coupled to the dispenser 108 in a parallel arrangement. A first branch 112a of a conduit 112 couples the first reservoir 110a to the dispenser 108 via a first valve 111a, and a second branch 112b of the conduit 112 couples the second reservoir 110b to the dispenser 108 via a second valve 111b. The first and second reservoirs 110a-b can individually include a tank constructed from a metal, a polymeric material, glass, and/or other material suitable for holding the first and second washing solutions 109a-b, respectively. The first and second valves 111a-b can individually include a ball valve, a butterfly valve, a needle valve, and/or other suitable valve. In certain embodiments, the conduit 112 can be flexible, and the dispensing assembly 104 can optionally include an actuator (not shown) configured to translate or otherwise move the dispenser 108 transversely across the microelectronic substrate 102 (as indicated by arrow A). In other embodiments, the conduit 112 can be substantially rigid, and the dispenser 108 can be fixed relative to the microelectronic substrate 102.

In further embodiments, the dispensing assembly 104 can further include meters, mixers, valves, and/or other fluid handling components.

The supporting assembly 106 can include a substrate support 114 disposed in a basin 116. The substrate support 114 can include a vacuum chuck, a mechanical chuck, and/or other suitable device for holding the microelectronic substrate 102. The substrate support 114 can also include a shaft 115 coupled to a motor (not shown) for rotating substrate support 114 about an axis 117 (as indicated by arrow R). The basin 116 can include an opening 118a and an outlet 118b in a bottom portion of the basin 116 that is coupled to a drain. The basin 116 can optionally include a strainer, a filter, and/or other fluid handling component (not shown).

In operation, after undergoing CMP or ECMP processing, the microelectronic substrate 102 can be placed on the substrate support 114 for cleaning. In one embodiment, the cleaning process can include a first cleaning procedure with the first washing solution 109a and followed by a second cleaning procedure with the second washing solution 109b. During the first cleaning procedure, an operator can open the first valve 111a to flow the first washing solution 109a from the first reservoir 110a to the dispenser 108 via the conduit 112. The dispenser 108 then distributes the first washing solution 109a into a surface of the microelectronic substrate 102 (as indicated by arrows 119). In certain embodiments, the first washing solution 109a can have a pressure generally less than about 1.0 psig. The pressure at the dispenser can be about 0.5 psig or about 0.2 psig. In other embodiments, the first washing solution 109a can have other desired pressures at the dispenser 108 to apply physical energy to the surface of the microelectronic substrate via spraying.

In certain embodiments, the dispenser 108 can be generally stationary relative to the microelectronic substrate 102 during the first cleaning procedure. In other embodiments, the dispenser 108 can translate transversely across the microelectronic substrate 102 while dispensing the first washing solution 109a onto the surface of the microelectronic substrate 102. Optionally, in any of the foregoing embodiments, the substrate support 114 can rotate about the axis 117 and can force the first washing solution 109a to flow on the surface of the microelectronic substrate 102 into the basin 116. The basin 116 then collects the spent first washing solution 109a and passes it to a drain via the outlet 118b.

The first washing solution 109a can include an oxidizer, a base, and a polyelectrolyte. The oxidizer can include ozone ($O_3$), hydrogen peroxide ($H_2O_2$), a permanganate salt (e.g., $KMnO_4$), a chromate salt (e.g., $NaCrO_4$), a perchlorate salt (e.g., $KClO_4$), hydroperoxide, and/or other suitable oxidizer. In certain embodiments, the oxidizer can have a concentration of about 0.1% to about 10% by volume. In other embodiments, the oxidizer can have a concentration of about 1% to about 5%, about 2% to about 4%, or about 3% by volume. The base can include ammonium hydroxide ($NH_4OH$), sodium hydroxide (NaOH), potassium hydroxide (KOH), and/or other suitable basic composition. In certain embodiments, the base can have a concentration of about 0.1% to about 10% by volume. In other embodiments, the base can have a concentration of about 0.5% to about 8%, about 1% to about 6%, or about 2% to about 4% by volume. In further embodiments, either the oxidizer or the base may be omitted from the first washing solution 109a.

The polyelectrolyte can include a polymeric material formed from monomers individually having an electrolytic function group. Examples of the electrolytic function group include the hydroxyl group (—OH), the carboxyl group (—COOH), the carboxamide group (—$CONH_2$), the amino group (—$NH_2$), the imine group (—C=NR), the imide group (RCONCOR', in which R is an alkyl group different than R'), the vinyl pyrrolidone group

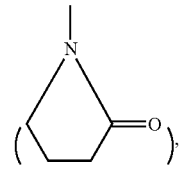

the vinyl pyridine group

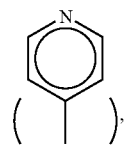

the nitro group (—$NO_2$), the sulfonate group (—$HSO_3$), the sulfate group (—$HSO_4$), and the phosphate group (—$HPO_4$), and/or other suitable electrolytic functional groups. In certain embodiments, the polyelectrolyte can have a concentration of about 0.01% to about 5% by weight. In other embodiments, the polyelectrolyte can have a concentration of about 0.05% to about 4%, about 0.1% to about 3%, or about 0.1% by weight. In further embodiments, the polyelectrolyte can have other suitable concentrations.

The polyelectrolyte can form an array of repetitive ionized functional groups carried on a carbon backbone in a solvent. For example, in several embodiments, the polyelectrolyte can include a polyacrylic acid (PAA) having the following chemical structure:

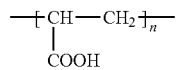

The polyelectrolyte can also include an anionic salt (e.g., a sodium salt as illustrated below) of the polyacrylic acid having the following chemical structure:

As a result, after dissolving in a solvent (e.g., deionized water), the PAA can form a long chain molecule having an array of repetitive ionized carboxyl groups (—$COO^-$) carried by a carbon backbone as follows:

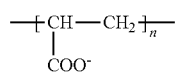

In certain embodiments, the array of ionized carboxyl groups can be arranged generally linearly. In other embodiments, the array of ionized carboxyl groups can form a sphere, a spiral, a zigzag, and/or other suitable arrangement.

In a particular embodiment, the first washing solution 109a can include 3 parts hydrogen peroxide by volume, 2 parts ammonium hydroxide by volume, and about 0.1% by weight PAA in 100 parts deionized water. The first washing solution 109a has a pH of about 10. In certain embodiments, the polyacrylic acid and/or the polyacrylate salt can have a molecular weight of about 2,000 to about 450,000. In other embodiments, the polyacrylic acid and/or the polyacrylate salt can have a molecular weight of about 10,000 to about 300,000, about 30,000 to about 200,000, or about 50,000 to about 100,000. In other embodiments, the first washing solution 109a can have other desired volume ratios and/or pH. In further embodiments, the first washing solution 109a can also include a pH buffer (e.g., the carbonic acid ($H_2CO_3$)), a chelating agent (e.g., a dicarboxylic acid), a corrosion inhibitor (e.g., benzotriazole), a surfactant (e.g., ammonium dodecyl sulfate, linear alkyl benzene, etc.), and/or other suitable composition. In yet further embodiments, the first washing solution 109a can include at least one of tetrabutylammonium perfluorooctanesulfonate (PFOS), sorbitan monolaurate (SPAN20), and/or other suitable surfactants in lieu of the polyelectrolyte.

The second washing solution 109b can include a composition different than that of the first washing solution 109a. For example, in certain embodiments, the second washing solution 109b can include an oxidizer (e.g., hydrogen peroxide ($H_2O_2$)), an acid (e.g., hydrochloric acid (HCl)), and optionally, an etchant (e.g., hydrofluoric acid (HF)) in an aqueous solution. In other embodiments, the second washing solution 109b can include a similar composition in an organic solution. In further embodiments, the second washing solution 109b can include a solvent (e.g., deionized water) without other chemical compositions.

The polyelectrolyte has been observed to chemically improve the PRE of the cleaning system 100 to reduce or eliminate the need to also apply physical energy to the substrate. It has also been observed that the addition of an organic additive (e.g., the polyelectrolyte, an anionic surfactant (e.g., PFOS), or a non-ionic surfactant (e.g., SPAN20)) can reduce material loss from the surface of the microelectronic substrate 102. As a result, longer washing periods (e.g., greater than about 2 minutes) may be used. The following discussion proposes several possible mechanisms that may improve the PRE, but it is understood that several embodiments of the cleaning system 100 and associated methods for cleaning microelectronic substrates can improve the PRE via a combination of these mechanisms or other mechanisms in addition to or in lieu of the mechanisms of action discussed below.

Without being bound by theory, it is believed that the polyelectrolyte can improve the PRE by homogenizing an electrokinetic potential (commonly referred to as a "zeta potential") of particles adsorbed onto the surface of the microelectronic substrate 102. Electrophoretic mobility measuring devices are common tools for deriving a zeta potential of particles. However, such measured zeta potential represents an average value for the particles. Individual particles, instead, may exhibit localized zeta potentials very different than the measured value. For example, an individual particle may have a first region with a zeta potential of about +10 mV, a second region with a zeta potential of about −80 mV, and an average zeta potential of about −50 mV. As a result, the first region of one particle may attract the second region of another particle more (or repulse it less) because of the different localized zeta potentials than if the particles have a homogeneous −50 mV zeta potential. It is believed that the polyelectrolyte with its array of ionized functional groups (e.g., the carboxyl groups of PAA) can substantially encapsulate particles inside a matrix of charge-conducting electrolytic groups. As a result, substantially all regions of an individual particle in the first washing solution 109a can be in electrical communication with one another to at least reduce regional differences in zeta potential, and thus increase the repulsive force between the particles and the surface of the microelectronic substrate.

Without being bound by theory, it is also or alternatively believed that polyelectrolyte adsorbed on the particles can modify the zeta potential of the particles because the matrix of ionized functional groups can form a new surface double layer around the particles suspended in the first washing solution 109a. It is also believed that the zeta potential of the particles may be modified by controlling the ionization characteristics of the polyelectrolyte. In certain embodiments, controlling the ionization characteristics of the polyelectrolyte can include varying the molecular weight of the polyelectrolyte and/or controlling the pH of the first washing solution 109a. In other embodiments, controlling the ionization characteristics can include selecting a suitable functional group for the polyelectrolyte based on a zeta potential of the particles, an isoelectric point of the particles, and/or other characteristics of the particles or the first washing solution 109.

Without being bound by theory, it is also or alternatively believed that the polyelectrolyte can improve the PRE by forming a barrier layer that may sterically hinder the adsorption or re-adsorption of the particles onto surface features (e.g., trenches) of the microelectronic substrate 102. For example, PAA with a molecular weight of 15,000 is believed to form a barrier layer with a thickness of about 2 nm on the particles containing silicon nitride. PAA with a molecular weight of 30,000 is believed to form a barrier layer with a thickness of about 3.5 nm on the particles containing silicon nitride. For the particles with a diameter of about 25 nm, the PAA barrier layer can substantially increase the volume of the particles and thus reduce the chance of being adsorbed in the trenches of the microelectronic substrate 102.

After flowing the first washing solution 109a for a first period of time (e.g., 5 minutes for batch processes and 30-90 seconds for single wafer processes), the operator can close the first valve 111a and end the first cleaning procedure. The operator can then start the second cleaning procedure by opening the second valve 111b to flow the second washing solution 109b from the second reservoir 110b to the dispenser 108 via the conduit 112 for a second period of time (e.g., about 1 to about 10 minutes for batch processes and 30-90 seconds for single wafer processes). In certain embodiments, the second washing solution 109b can include hydrogen peroxide and hydrochloric acid in deionized water. In these embodiments, it is believed that the second washing solution 109b can remove metallic contamination (e.g., metallic chlorides) on the surface of the microelectronic substrate 102. In other embodiments, the second cleaning procedure can include rinsing the surface of the microelectronic substrate 102 with only deionized water. In further embodiments, the second cleaning procedure may be omitted. In any of the foregoing embodiments, the operator can optionally remove any remaining polyelectrolyte using oxygen plasma, wet chemical treatments with sulfuric acid ($H_2SO_4$) and hydrogen peroxide ($H_2O_2$) at a temperature of about 100° C. to about 140° C., and/or other suitable techniques.

Several embodiments of the cleaning system 100 can more efficiently remove adsorbed solid particles from the surface of the microelectronic substrate 102 than conventional techniques. The inventors have recognized that the addition of the polyelectrolyte in the first washing solution 109a can statistically improve the PRE over utilizing conventional cleaning solutions, e.g., an aqueous solution of hydrogen peroxide ($H_2O_2$) and ammonium hydroxide ($NH_4OH$), commonly referred to as "SC1," with or without the addition of anionic or non-ionic surfactants. As a result, shorter cleaning periods may be utilized to increase throughput.

Several embodiments of the cleaning system 100 can also reduce or prevent material loss (commonly referred to as an "undercut") caused by a washing solution. According to conventional techniques, an etchant (e.g., hydrofluoric acid (HF)) is included in a washing solution to overcome Van der Waals forces between adsorbed particles and a microelectronic substrate. The etchant, however, also removes material from the surface of the microelectronic substrate and can generate surface defects generally referred to as "HF defects." The HF defects are considered destructive because they can render the microelectronic substrate unacceptable for subsequent processing steps (e.g., component formation). As a result, such material loss at the surface of the microelectronic substrate 102 caused by the washing solution may not be tolerated. It is believed that the polyelectrolyte additive, the anionic surfactant, or the non-ionic surfactant can adsorb to the surface of the microelectronic substrate, and thus passivate and protect the surface from material loss.

Even though the cleaning system 100 illustrated in FIG. 1 has a first reservoir 110a and a second reservoir 110b, in certain embodiments, the cleaning system 100 can include more or less reservoirs holding the same or different washing solutions. For example, the cleaning system 100 may also include a third reservoir (not shown) holding deionized water for rinsing the microelectronic substrate 102 after the first and/or second cleaning procedure. In another example, the first washing solution 109a can contain a first polyelectrolyte, and the second reservoir 110b can contain a second polyelectrolyte that is different than the first polyelectrolyte. The first and second polyelectrolytes can be selected to remove different particles from the surface of the microelectronic substrate 102.

Figure 2:
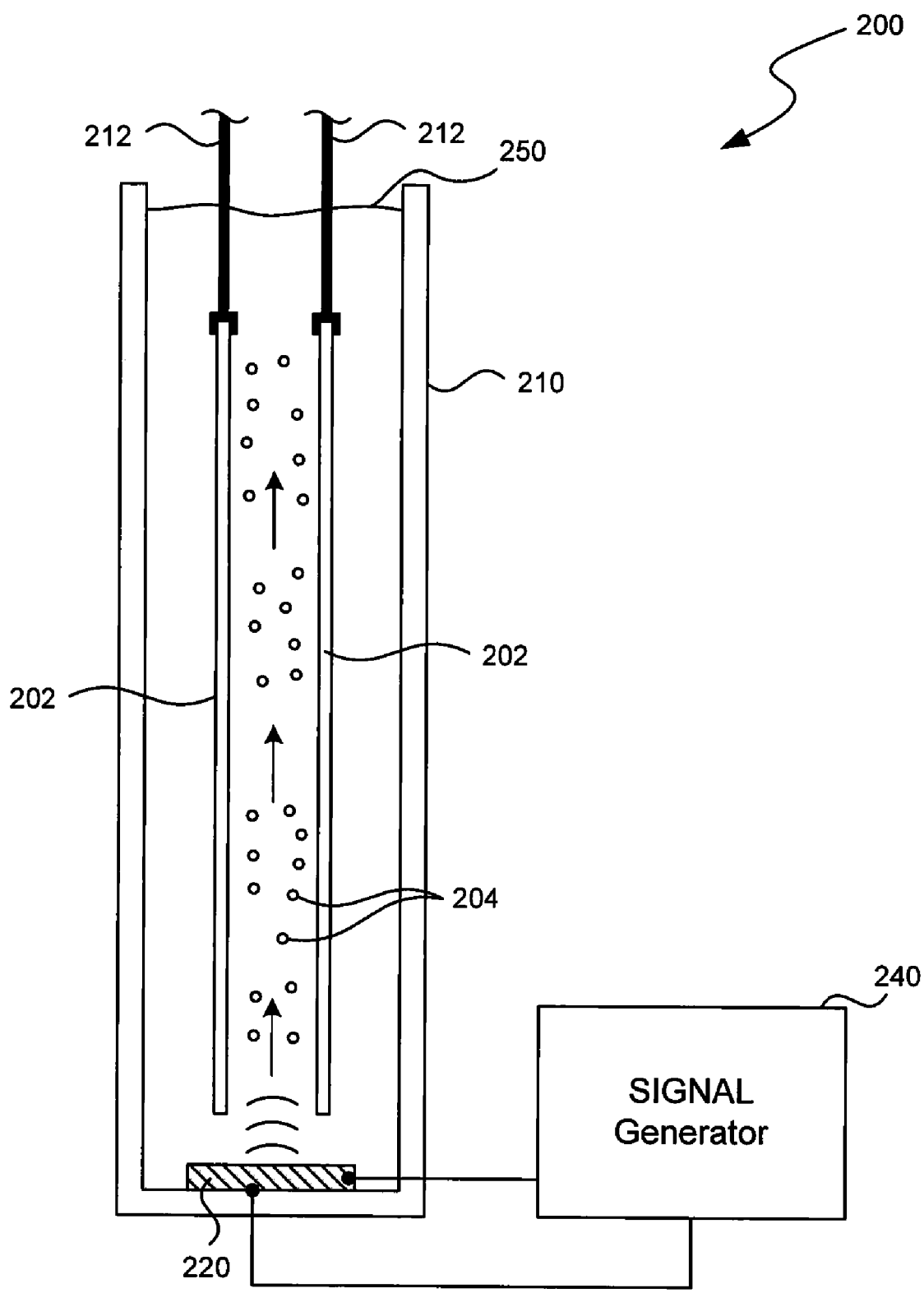
FIG. 2 is a schematic cross-sectional view of a cleaning system configured in accordance with another embodiment of the disclosure.

FIG. 2 is schematic cross-sectional view of a cleaning system 200 configured in accordance with another embodiment of the disclosure. The cleaning system 200 includes a process tank or vessel 210 and support elements 212 for carrying microelectronic substrates 202. The process tank 210 can contain a washing solution 250 with a composition generally similar to that of the first washing solution 109a discussed above with reference to FIG. 1. The cleaning system 200 can also optionally include a transducer 220 in the process tank 210 and a signal generator 240 operably coupled with the transducer 220. The transducer 220 can include piezoelectric or other mechanical elements that can be electrically driven by the signal generator 240 to deliver sonic pressure waves through the washing solution 250.

In operation, the support elements 212 can secure the microelectronic substrates 202 in the washing solution 250. Then, in certain embodiments, the optional signal generator 240 can generate signals that energize the transducer 220 to produce cavitation in the washing solution 250. Cavitation generally refers to the creation and subsequent collapse of microscopic bubbles 204. It is believed that the bubbles 204 can grow to a certain size and then can partially collapse or completely implode. The collapse or implosion of the bubbles 204 can impart energy to a surface of the microelectronic substrates 202 to facilitate dislodging particles from the microelectronic substrates 202. In other embodiments, the microelectronic substrates 202 may be submerged in the washing solution 250 for a period of time (e.g., 10 minutes) without energizing the transducer 220 or otherwise imparting physical energy onto the microelectronic substrates 202.

Several embodiments of the cleaning system 200 can effectively clean microelectronic substrates 202 with reduced sonic energy than conventional techniques. As discussed above, the washing solution 250 having a polyelectrolyte can chemically increase the repulsive forces between solid particles and/or the microelectronic substrates 202 than conventional techniques. As a result, less or no physical energy may be required to dislodge adsorbed particles from the microelectronic substrates 202. Accordingly, the risk of damaging surface features on the microelectronic substrates 202 can be reduced.

Several experiments were conducted to determine the effectiveness of cleaning solutions to remove adsorbed particles from a surface of a microelectronic wafer. The surface containing a thermal silicon oxide ($SiO_2$) layer. In the experiments, silicon nitride particles were first adsorbed onto the surface of the microelectronic wafer. A dark-light inspection system (Model No. Surfscan SP2) supplied by KLA-Tencor of San Jose, Calif., was used to count the number of the adsorbed particles. The microelectronic wafer was then transferred to a cleaning system generally similar to that described above with reference to FIG. 1. A washing solution was then dispensed onto the surface of the microelectronic wafer for about 30 seconds. Then, the microelectronic wafer was rinsed with deionized water while spinning for about 30 seconds and subsequently dried. The dried microelectronic wafer was then inspected again using the dark-light inspection system to determine the number of particles remaining on the surface of the microelectronic wafer. Then, PRE was calculated based on the number of particles before and after the cleaning procedure as follows:

$$PRE = \frac{(N_1 - N_2)}{N_1} \times 100\%$$

where $N_1$ is the number of particles before the cleaning procedure, and $N_2$ is the number of particles after the cleaning procedure. The surface of the microelectronic wafer was also inspected for zeta potential and material loss (as represented by etch delta). Even though the experiments were conducted with a silicon oxide layer on the surface of the microelectronic substrate, it is believed that similar results can be achieved with titanium nitride ($TiN_x$) layers, tungsten (W) layers, and polysilicon (Si) layers.

In a first set of experiments, the washing solution includes a SC1 solution having 3 parts hydrogen peroxide ($H_2O_2$), 2 parts ammonium hydroxide ($NH_4OH$), and 100 parts deionized water by volume. In a second set of experiments, the washing solution includes the SC1 solution with 0.1% weight addition of tetrabutylammonium perfluorooctanesulfonate (PFOS). In a third set of experiments, the washing solution includes the SC1 solution with 0.1% weight addition of sorbitan monolaurate (SPAN20). In a fourth set of experiments, the washing solution includes the SC1 solution with 0.1% weight addition of PAA with a molecular weight of about 50,000. All these washing solutions had a pH of about 10 to about 10.3 and were maintained at about 65° C. Even though the experiments were directed toward adding PAA to SC1, it is expected that adding other polyelectrolyte compounds would yield similar results.

Figure 3:
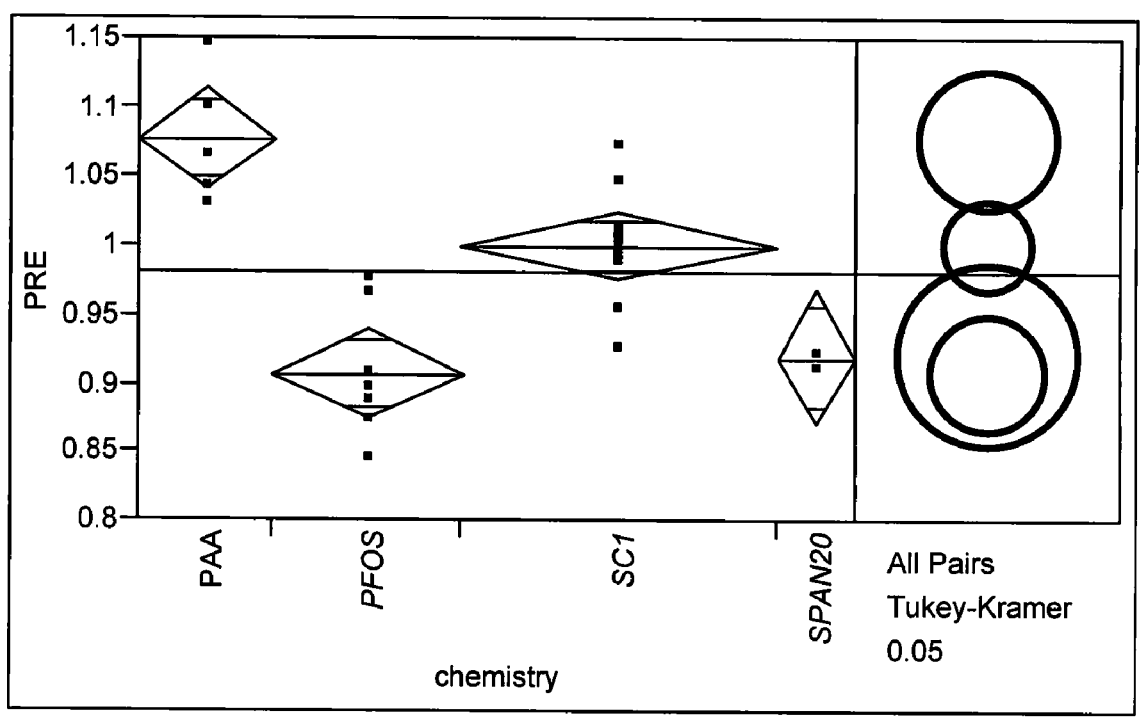
FIG. 3 is a plot of particle removal efficiency (PRE) of various washing solutions in accordance with an embodiment of the disclosure.

The following table shows the PRE results from these experiments using the foregoing washing solutions, and FIG. 3 is a plot of these results in accordance with an embodiment of the disclosure.

| Washing Solution | Number of Samples | Mean PRE | Standard Error |
|---|---|---|---|
| SC1 | 12 | 0.99958 | 0.01178 |
| With PFOS | 7 | 0.90700 | 0.01542 |
| With SPAN20 | 3 | 0.92000 | 0.02355 |
| With PAA | 5 | 1.07560 | 0.01824 |

As can be seen from the table above and FIG. 3, the washing solutions with the anionic surfactant and the non-ionic surfactant performed generally equivalent to or worse than SC1. The washing solution with PAA, however, outperformed SC1 by about 2% to about 13% based on normalized PRE.

Figure 4:
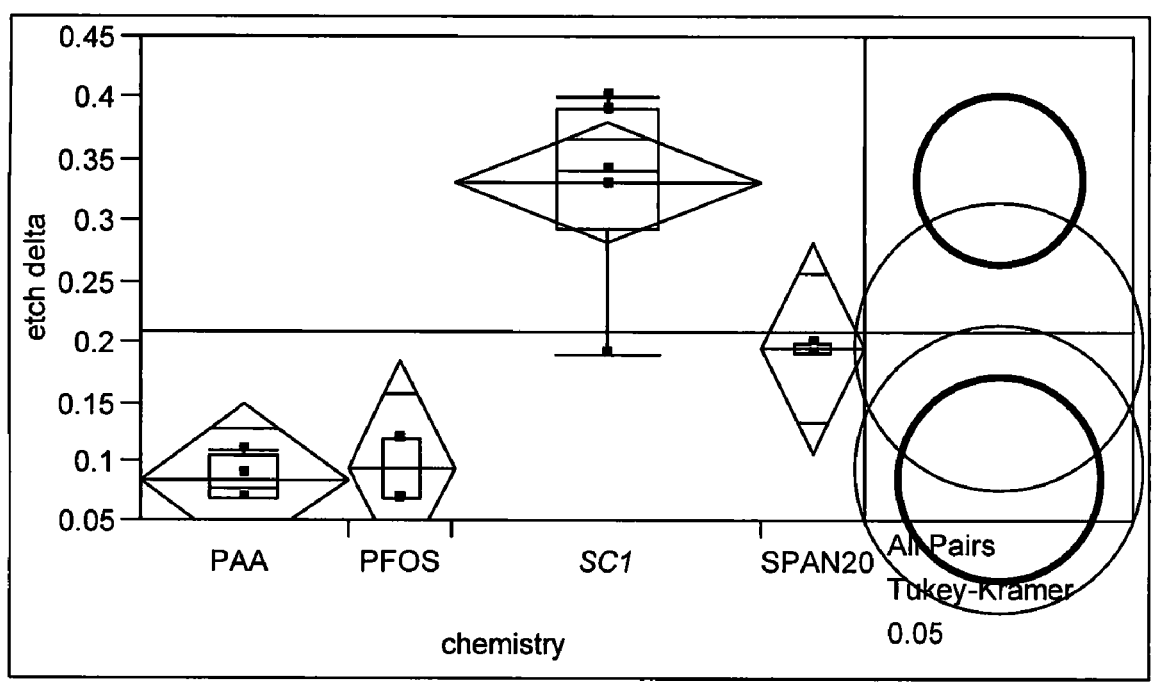
FIG. 4 is a plot of etch delta of various washing solutions in accordance with an embodiment of the disclosure.

The following table shows the HF defect results from these experiments as represented by etch delta, and FIG. 4 is a plot of the etch delta of various washing solutions in accordance with an embodiment of the disclosure.

| Washing Solution | Number of Samples | Mean Etch Delta (Å) | Standard Error |
|---|---|---|---|
| SC1 | 6 | 0.331667 | 0.02261 |
| With PFOS | 7 | 0.095000 | 0.03917 |
| With SPAN20 | 2 | 0.195000 | 0.03917 |
| With PAA | 4 | 0.085000 | 0.02770 |

As can be seen from the table above and FIG. 4, the solutions with an organic additive (e.g., PAA, PFOS, or SPAN20) all had less etch delta than the SC1 solution. The washing solution with PAA has the least etch delta when compared to the SC1 solution and those solutions with the anionic surfactant and the non-ionic surfactant. As a result, the washing solution with PAA, the anionic surfactant, or the non-ionic surfactant had reduced material loss from the surface of the microelectronic substrate than SC1.

Figure 5:
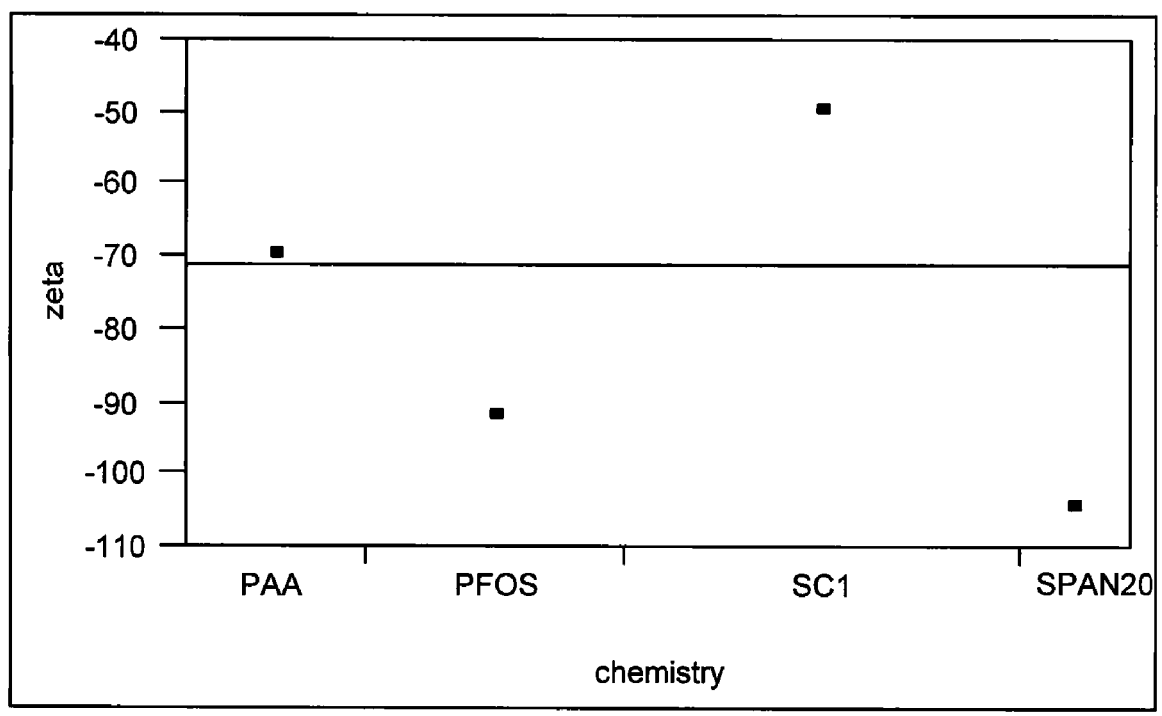
FIG. 5 is a plot of average zeta potential of various washing solutions in accordance with an embodiment of the disclosure.

The following table shows the average zeta potential results from these experiments, and FIG. 5 is a plot of the average zeta potential of various washing solutions in accordance with an embodiment of the disclosure.

| Washing Solution | Number of Samples | Mean Zeta Potential (mV) | Standard Error |
|---|---|---|---|
| SC1 | 6 | −70.00 | 0.02261 |
| With PFOS | 2 | −92.00 | 0.03917 |
| With SPAN20 | 2 | −50.00 | 0.03917 |
| With PAA | 4 | −105.00 | 0.02770 |

As can be seen from the table above and FIG. 5, the washing solutions with the anionic surfactant and the non-ionic surfactant had a larger impact on the average zeta potential of the particles than the washing solution with PAA. As a result, the improved PRE performance of the washing solution with PAA is probably not due to increased average electrostatic repulsion.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

We claim:

1. A method for cleaning a microelectronic substrate having a surface containing adsorbed particles, comprising:
   supplying a washing solution to the microelectronic substrate, the washing solution including an oxidizer, a base, and a polyelectrolyte with a concentration of about 0.01% to about 5% by weight;
   contacting the washing solution with the surface of the microelectronic substrate for a period of time;
   controlling an ionization characteristic of the polyelectrolyte based on an isoelectric point of the adsorbed particles; and
   at least partially removing the adsorbed particles from the surface of the microelectronic substrate with the washing solution, wherein controlling an ionization characteristic includes selecting at least one of a molecular weight of the polyelectrolyte and a functional group of the polyelectrolyte based on a target average electrokinetic potential of the particles.

2. The method of claim 1 wherein supplying a washing solution includes dispensing a washing solution onto the surface of the microelectronic substrate, the washing solution including hydrogen peroxide with a concentration of about 3% by volume and ammonium hydroxide with a concentration of about 2% to about 4% by volume, and wherein the polyelectrolyte includes a polyacrylic acid having a molecular weight of about 50,000 to about 100,000.

3. The method of claim 1, further comprising homogenizing an electrokinetic potential of the particles with the polyelectrolyte.

4. The method of claim 1, further comprising homogenizing an electrokinetic potential of the particles with the polyelectrolyte and at least reducing regional differences of electrokinetic potential in the particles.

5. The method of claim 1, further comprising homogenizing an electrokinetic potential of the particles and modifying an average electrokinetic potential of the particles with the polyelectrolyte.

6. The method of claim 1, further comprising achieving a target average electrokinetic potential of the particles with the controlled ionization characteristics of the polyelectrolyte.

7. The method of claim 1, further comprising removing the polyelectrolyte with an oxygen plasma and/or a solution containing sulfuric acid (H2SO4) and hydrogen peroxide (H2O2).

8. A method for cleaning a microelectronic substrate, comprising:
   dispensing a washing solution onto a surface of the microelectronic substrate having adsorbed particles, the washing solution including a polyelectrolyte formed by monomers individually having an ionic functional group;
   contacting the washing solution with the surface of the microelectronic substrate;
   controlling an ionization characteristic of the polyelectrolyte based on an isoelectric point of the adsorbed particles; and
   at least partially removing the adsorbed particles on the surface of the microelectronic substrate without applying physical energy, wherein controlling an ionization characteristic includes selecting at least one of a molecular weight of the polyelectrolyte and a functional group of the polyelectrolyte based on a target average electrokinetic potential of the particles.

9. The method of claim 8 wherein dispensing a washing solution includes dispensing a washing solution onto the surface of the microelectronic substrate, the washing solution including a polyelectrolyte formed by monomers individually having a hydrophilic functional group.

10. The method of claim 8 wherein dispensing a washing solution includes dispensing a washing solution onto the surface of the microelectronic substrate, the washing solution including a polyelectrolyte formed by monomers individually having a functional group that includes at least one of a hydroxyl group (—OH), a carboxyl group (—COOH), a carboxamide group (—CONH2), an amino group (—NH2), an imine group (—C=NR), an imide group (RCONCOR', in which R is an alkyl group different than R'), a vinyl pyrrolidone group

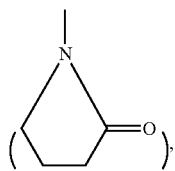

a vinyl pyridine group

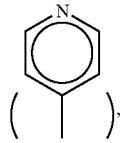

a nitro group (—NO2), a sulfonate group (—HSO3), a sulfate group (—HSO4), and a phosphate group (—HPO4).

11. A method for cleaning a microelectronic substrate having a surface containing adsorbed particles, comprising:
contacting the surface of the microelectronic substrate with a washing solution, the washing solution consisting essentially of hydrogen peroxide, ammonium hydroxide, and a polyacrylic acid and/or a salt thereof having a concentration of about 0.01% to about 5% by weight;
controlling an ionization characteristic of the polyacrylic acid and/or the salt thereof based on an isoelectric point of the adsorbed particles; and
removing the adsorbed particles from the surface of the microelectronic substrate with the washing solution, wherein controlling an ionization characteristic includes selecting at least one of a molecular weight of the polyelectrolyte and a functional group of the polyelectrolyte based on a target average electrokinetic potential of the particles.

12. The method of claim 11 wherein the hydrogen peroxide has a concentration of about 3% by volume, and wherein the ammonium hydroxide has a concentration of about 2% to about 4% by volume, and further wherein the polyacrylic acid and/or the salt thereof have a molecular weight of about 50,000 to about 100,000.

13. The method of claim 11, further comprising at least partially homogenizing an electrokinetic potential of the particles with the washing solution.

14. The method of claim 11, further comprising at least partially homogenizing an electrokinetic potential of the particles with the washing solution and at least reducing regional differences of electrokinetic potential in the particles.

15. The method of claim 11, further comprising adjusting a characteristic of the washing solution based on a correlation between a characteristic of the polyacrylic acid and/or the salt thereof and a particle removal efficiency of the washing solution, the particle removal efficiency is defined as a percentage of particles remaining on the surface of the microelectronic substrate after the washing solution contacts the surface for a select period of time.

16. The method of claim 11, further comprising adjusting an ionization characteristic of the polyacrylic acid and/or the salt thereof to achieve a desired particle removal efficiency, the particle removal efficiency is defined as a percentage of particles remaining on the surface of the microelectronic substrate after the washing solution contacts the surface for a select period of time.

17. The method of claim 11, further comprising adjusting a molecular weight of the polyacrylic acid and/or the salt thereof to achieve a desired particle removal efficiency, the particle removal efficiency is defined as a percentage of particles remaining on the surface of the microelectronic substrate after the washing solution contacts the surface for a select period of time.

18. The method of claim 11, further comprising adjusting a molecular weight of the polyacrylic acid and/or the salt thereof and a pH of the washing solution to achieve a desired particle removal efficiency, the particle removal efficiency is defined as a percentage of particles remaining on the surface of the microelectronic substrate after the washing solution contacts the surface for a select period of time.

* * * * *